US012755075B2

(12) United States Patent
Shao et al.

(10) Patent No.: US 12,755,075 B2
(45) Date of Patent: Oct. 6, 2026

(54) METHODS FOR CONSTRUCTION PLANNING OF CHARGING PILES IN THE SMART CITIES AND INTERNET OF THINGS SYSTEMS THEREOF

(71) Applicant: CHENGDU QINCHUAN IOT TECHNOLOGY CO., LTD., Chengdu (CN)

(72) Inventors: Zehua Shao, Chengdu (CN); Yong Li, Chengdu (CN); Junyan Zhou, Chengdu (CN); Yaqiang Quan, Chengdu (CN); Yongzeng Liang, Chengdu (CN)

(73) Assignee: CHENGDU QINCHUAN IOT TECHNOLOGY CO., LTD., Chengdu (CN)

( * ) Notice: Subject to any disclaimer, the term of this patent is extended or adjusted under 35 U.S.C. 154(b) by 1001 days.

(21) Appl. No.: 18/054,156

(22) Filed: Nov. 10, 2022

(65) Prior Publication Data

US 2023/0068677 A1 Mar. 2, 2023

(30) Foreign Application Priority Data

Oct. 18, 2022 (CN) ......................... 202211269602.8

(51) Int. Cl.
*G06F 30/27* (2020.01)
*G06F 30/13* (2020.01)
*G16Y 20/10* (2020.01)

(52) U.S. Cl.
CPC .............. *G06F 30/27* (2020.01); *G06F 30/13* (2020.01); *G16Y 20/10* (2020.01)

(58) Field of Classification Search
CPC .......... G06F 30/27; G06F 30/13; G16Y 20/10
(Continued)

(56) References Cited

U.S. PATENT DOCUMENTS 8,892,408 B2 * 11/2014 Sturdza .................. G06F 30/23 703/2
10,469,898 B2 * 11/2019 Wang .................... H04L 65/765
(Continued)

FOREIGN PATENT DOCUMENTS

CN 110288159 A 9/2019
CN 110895638 A 3/2020
(Continued)

OTHER PUBLICATIONS

Xu et al. (A Deployment Model of Charging Pile based on Random Forest for Shared Electric Vehicle in Smart Cities,2018, IEEE, pp. 49-54) (Year: 2018).*
(Continued)

*Primary Examiner* — Iftekhar A Khan
(74) *Attorney, Agent, or Firm* — METIS IP LLC

(57) ABSTRACT

The embodiments of the present disclosure provide a method for construction planning of a charging pile in a smart city. The method is implemented based on a management platform of an Internet of Things system for construction planning of the charging pile in the smart city. The method comprises: obtaining a region feature of a region to be expanded; determining at least one candidate construction site based on the region feature; the region feature at least including distribution of people flow in the region to be expanded and distribution of existing charging piles in the region to be expanded; and determining at least one target construction site based on the at least one candidate construction site.

11 Claims, 6 Drawing Sheets

200

(58) Field of Classification Search
USPC .............................................................. 703/2
See application file for complete search history.

(56) References Cited

U.S. PATENT DOCUMENTS

| | | | | |
|---|---|---|---|---|
| 11,444,338 | B1 * | 9/2022 | Dhawan | H01M 50/569 |
| 11,587,436 | B1 * | 2/2023 | Shao | G08G 1/0129 |
| 11,676,219 | B2 * | 6/2023 | Cella | G06Q 10/40 705/38 |
| 12,014,292 | B2 * | 6/2024 | Shim | G06F 17/18 |
| 12,033,338 | B2 * | 7/2024 | Nekkah | G01S 7/4808 |
| 12,050,981 | B2 * | 7/2024 | Madasu | E21B 41/00 |
| 2011/0202487 | A1 * | 8/2011 | Koshinaka | G06N 20/10 706/12 |
| 2012/0296616 | A1 * | 11/2012 | Tsunoda | G06G 7/57 703/9 |
| 2013/0246027 | A1 * | 9/2013 | Rodriguez | G06F 30/15 703/9 |
| 2015/0293138 | A1 * | 10/2015 | Briod | G05D 1/00 702/142 |
| 2018/0260501 | A1 * | 9/2018 | Dweik | G06F 30/28 |
| 2018/0260513 | A1 * | 9/2018 | Dweik | G06F 30/28 |
| 2018/0375939 | A1 * | 12/2018 | Magalhães de Matos | H04L 67/61 |
| 2018/0376305 | A1 * | 12/2018 | Ramalho de Oliveira | H04W 4/44 |
| 2019/0085879 | A1 * | 3/2019 | Frohnapfel | F15D 1/001 |
| 2019/0197435 | A1 * | 6/2019 | Kobayashi | G06N 20/20 |
| 2020/0175700 | A1 * | 6/2020 | Zhang | G06V 10/26 |
| 2020/0335228 | A1 * | 10/2020 | Yuan | H04L 67/565 |
| 2020/0387579 | A1 * | 12/2020 | Barr | G06F 30/367 |
| 2022/0101103 | A1 * | 3/2022 | Fatemi | G06N 3/045 |
| 2022/0107256 | A1 * | 4/2022 | Buoso | G16H 30/40 |
| 2022/0164603 | A1 * | 5/2022 | Zhou | G06V 20/56 |
| 2022/0236075 | A1 * | 7/2022 | Ho | G01C 21/3833 |
| 2022/0319314 | A1 * | 10/2022 | Xu | G08G 1/0112 |
| 2022/0368163 | A1 * | 11/2022 | Paduvalli | H02J 50/20 |
| 2023/0048067 | A1 * | 2/2023 | Liu | G01V 20/00 |
| 2023/0051766 | A1 * | 2/2023 | Beaurepaire | B60L 53/31 |
| 2023/0052733 | A1 * | 2/2023 | Beaurepaire | B60L 53/68 |
| 2023/0068677 | A1 * | 3/2023 | Shao | G06Q 10/04 |
| 2023/0087199 | A1 * | 3/2023 | Shao | H04L 67/52 705/26.7 |
| 2023/0111871 | A1 * | 4/2023 | Ramsundar | G06F 30/28 703/9 |
| 2023/0124522 | A1 * | 4/2023 | Shao | G08G 1/052 340/907 |
| 2023/0168094 | A1 * | 6/2023 | Beaurepaire | G01C 21/3697 701/425 |
| 2024/0054270 | A1 * | 2/2024 | Kitoh | G06F 30/28 |

FOREIGN PATENT DOCUMENTS

| | | | | |
|---|---|---|---|---|
| CN | 110991914 A | | 4/2020 | |
| CN | 111898860 A | | 11/2020 | |
| CN | 113642757 A | * | 11/2021 | G06Q 10/0631 |
| CN | 113869713 A | | 12/2021 | |
| CN | 114418468 A | | 4/2022 | |

OTHER PUBLICATIONS

Kong et al. (Charging Pile Siting Recommendations via the Fusion of Points of Interest and Vehicle Trajectories, China Communications • Nov. 2017, pp. 29-38) (Year: 2017).*

He et al. (Optimal Site Selection Planning of EV Charging Pile Based on Genetic Algorithm, China Communications, IEEE, 2020, pp. 1799-1803) (Year: 2020).*

Qie, Peiqi et al., Research on AGV Charging Pile Location Based on Region Busyness, Manufacturing Automation, 2023, 9 pages.

First Office Action in Chinese Application No. 202211269602.8 mailed on Oct. 28, 2025, 26 pages.

* cited by examiner

500

METHODS FOR CONSTRUCTION PLANNING OF CHARGING PILES IN THE SMART CITIES AND INTERNET OF THINGS SYSTEMS THEREOF

CROSS-REFERENCE TO RELATED APPLICATIONS

This application claims priority of Chinese Patent Application No. 202211269602.8, filed on Oct. 18, 2022, the entire contents of which are incorporated herein by reference.

TECHNICAL FIELD

This present disclosure relates to the field of charging pile construction, and in particular to a method for construction planning of a charging pile in a smart city and an Internet of Things system.

BACKGROUND

Vehicle travel is a commonly used travel mode. With the development of technology, electric vehicles have gradually entered the vehicle travel market. Electric vehicles need to be charged. At present, the charging method of electric vehicles mainly depends on charging piles. However, the construction of charging piles as supporting infrastructure currently has the problems of affecting power quality, many installation restrictions, less profit, and less quantity. At the same time, due to the unreasonable layout planning, some charging piles are idle, and some charging piles are in short supply. Reasonable site selection planning of charging piles of electric vehicle may enable users and service providers to achieve a win-win relationship and promote the large-scale development of electric vehicles.

Therefore, it is hoped to provide a method for construction planning of a charging pile in a smart city and an Internet of Things system, which may determine appropriate construction sites of charging pile to improve the utilization rate and revenue of charging piles while improving the user experience.

SUMMARY

One or more embodiments of the present disclosure provide a method for construction planning of a charging pile in a smart city. The method is implemented based on a management platform of an Internet of Things system for construction planning of the charging pile in the smart city. The method comprises: obtaining a region feature of a region to be expanded; determining at least one candidate construction site based on the region feature; the region feature at least including distribution of people flow in the region to be expanded and distribution of existing charging piles in the region to be expanded; and determining at least one target construction site based on the at least one candidate construction site.

One or more embodiments of the present disclosure provide an Internet of Things system for construction planning of a charging pile in a smart city. The system includes a user platform, a service platform, a management platform, a sensor network platform, and an object platform. The sensor network platform includes a plurality of sensor network sub-platforms, and different regions to be expanded correspond to different the sensor network sub-platforms. The management platform includes a general database of management platform and a plurality of management sub-platforms. The object platform is configured to obtain a region feature of a region to be expanded. The sensor network sub-platform is configured to obtain the region feature of the corresponding region to be expanded based on the object platform, and upload the region feature to the corresponding management sub-platform. The management sub-platform is configured to perform the operations including: determining at least one candidate construction site based on the region features; the region features including at least distribution of people flow in the region to be expanded and distribution of existing charging piles in the region to be expanded; determining at least one target construction site based on at least one candidate construction site; and transmitting at least one target construction site to the service platform through the general database of management platform. The service platform is configured to upload the at least one target construction site to the user platform.

One or more embodiments of the present disclosure provide a non-transitory computer-readable storage medium, the storage medium stores computer instructions, and after the computer reads the computer instructions in the storage medium, the computer executes a method for construction planning of a charging pile in a smart city.

BRIEF DESCRIPTION OF THE DRAWINGS

The present disclosure is further illustrated in terms of exemplary embodiments. These exemplary embodiments are described in detail with reference to the drawings. These embodiments are not restricted. In these embodiments, the same number indicates the same structure, wherein.

DETAILED DESCRIPTION

Figure 1:
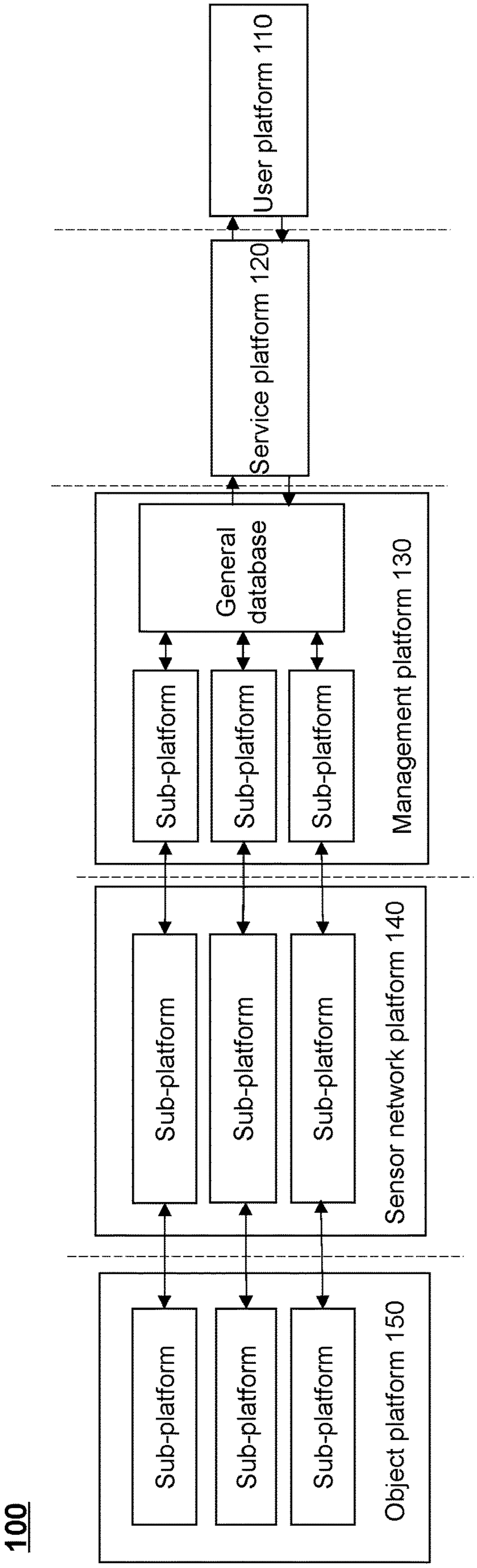
FIG. 1 is a structural diagram of the Internet of Things system for construction planning of the charging pile in a smart city according to some embodiments of the present disclosure.

In order to more clearly explain the technical scheme of the embodiment of the present disclosure, the accompanying drawings required in the description of the embodiment will be briefly introduced below. Obviously, the drawings in the following description are only some examples or embodiments of the present disclosure. For those skilled in the art, without creative effort, the present disclosure can also be applied to other similar situations according to these drawings. Unless obviously obtained from the context or the context illustrates otherwise, the same numeral in the drawings refers to the same structure or operation.

It should be understood that "system", "device", "unit" and/or "module" as used herein is a method used to distinguish different components, elements, parts, sections or assemblies at different levels. However, if other words can achieve the same purpose, they can be replaced by other expressions.

As shown in the present disclosure and claims, unless the context clearly dictates otherwise, the words "a", "an", "an" and/or "the" are not intended to be specific in the singular and may include the plural. Generally speaking, the terms "comprising" and include" only imply that the clearly identified steps and elements are included, and these steps and elements do not constitute an exclusive list, and the method or apparatus may also include other steps or elements.

Flowcharts are used in the present disclosure to illustrate operations performed by a system according to an embodiment of the present disclosure. It should be understood that the previous or subsequent operations may not be accurately implemented in order. Instead, the various steps may be processed in reverse order or simultaneously. Meanwhile, other operations may also be added to these processes, or a certain step or several steps may be removed from these processes.

FIG. 1 is a structural diagram of the Internet of Things system for construction planning of the charging pile in a smart city according to some embodiments of the present disclosure.

As shown in FIG. 1, the Internet of Things system for construction planning of the charging pile in a smart city 100 includes a user platform 110, a service platform 120, a management platform 130, a sensor network platform 140, and an object platform 150.

The user platform 110 may be a platform for interacting with users. Users may be managers, city construction personnel, etc. In some embodiments, the user platform 110 may be configured as a terminal device, for example, the terminal device may include a mobile device, a tablet computer, or the like, or any combination thereof. In some embodiments, the user platform 110 may feed information back to the user through the terminal device. For example, the user platform 110 may feed a construction planning result of urban charging piles back to the user through the terminal device (e.g., a display).

In some embodiments, the user platform 110 may interact with the service platform 120. For example, the user platform 110 may issue a query instruction of construction planning of urban charging piles to the service platform 120, and the user platform 110 may receive a construction planning scheme of urban charging piles uploaded by the service platform 120, or the like.

The service platform 120 may be a platform for conveying the user's needs and control information. The service platform 120 connects the user platform 110 and the management platform 130. In some embodiments, the service platform 120 may employ a centralized layout. The centralized layout refers to the unified reception, transmission, and processing of data by the service platform 120. For example, the service platform 120 may send request information of the user for construction of the charging pile to the management platform 130. As another example, the service platform 120 may send the construction planning result of the charging pile generated by the management platform 130 to the user platform 110.

In some embodiments, the service platform 120 may interact with the management platform 130. For example, the service platform 120 may issue a query instruction of construction planning of urban charging piles to the management platform 130 (general database), and the service platform 120 may receive the construction planning scheme of urban charging piles uploaded by the management platform 130 (general database). In some embodiments, the service platform 120 may interact with the user platform 110. For example, the service platform 120 may receive the query instruction of construction planning of urban charging piles issued by the user platform 110, and the service platform 120 may upload the construction planning scheme of urban charging piles to the user platform 110.

The management platform 130 may refer to a platform for overall planning and coordinating the connection and cooperation between various functional platforms, gathering all the information of the Internet of Things, and providing perception management and control management functions for the Internet of Things operation system. For example, the management platform 130 may be used to execute a method for construction planning of a charging pile in a smart city, process data related to the construction planning of charging pile in response to the needs of construction planning of the urban charging pile to determine the construction planning scheme of urban charging pile. In some embodiments, the management platform 130 may include processing devices as well as other components. The processing device may be a server or a server group. In some embodiments, the management platform 130 may be a remote platform manipulated by managers, artificial intelligence, or a preset rule.

In some embodiments, the management platform 130 may employ a front sub-platform layout. The front sub-platform layout may refer to the management platform including a general database and a plurality of management sub-platforms. A plurality of management sub-platforms respectively obtains data of different types or sources from the object platform 150 through the sensor network platform 140 for storage and processing and aggregate the data into the general database for storage and management. The management platform 130 may transmit data to the service platform 120 through the general database.

In some embodiments, the plurality of management sub-platforms included in the management platform 130 may be determined according to a division of urban region. For example, the management platform 130 may include the plurality of sub-platforms, such as a management sub-platform of the region A, a management sub-platform of the region B, and a management sub-platform of the region C.

In some embodiments, in response to charging pile construction requirements of the user, the management platform 130 may obtain relevant information on the charging piles in the corresponding region from the sensor network platform 140, and then process and manage the data related to construction planning of the charging pile in each region. In some embodiments, the data related to construction planning of the charging pile include region features of various regions of the city, data related to charging piles in the region, or the like. The region features of various regions of the city may include roads, facilities, places, transportation networks, economic development, people flow, and the flow of electric vehicles, or the like.

In some embodiments, the region features of various regions of the city may be obtained based on the management sub-platform or based on a third party (e.g., city planning bureau, street office, etc.). The data related to charging piles in the region may include the basic information of the charging piles (such as type, model, manufacturer, output voltage, power, etc.), and the operational data of the charging piles (such as the frequency of use, daily service time, service interval, etc.). The data related to charging piles in the region may be obtained based on the object platform (e.g., charging pile device). For example, the management platform 130 may store, analyze and process the relevant information of construction planning of the charging pile in region A, region B, and region C through the management sub-platform of the region A, the management sub-platform of the region B, and the management sub-platform of the region C, respectively, and upload the relevant information of construction planning of the charging pile to the general database of the management platform 130. The management platform 130 may further analyze and process the relevant data of the construction planning of the charging pile in the general database, and upload the construction planning information of charging pile to the service platform 120 through the general database.

In some embodiments, the management platform 130 may interact with the sensor network platform 140. For example, the management platform 130 (each management sub-platform) may receive the data related to charging piles in each region uploaded by the sensor network platform 140 (each sensor network sub-platform) for processing, and the management platform 130 (each management sub-platform) may issue an instruction for obtaining the relevant data of the charging pile to the sensor network platform 140 (each sensor network sub-platform). In some embodiments, the management platform 130 may interact with the service platform 120. For example, the management platform 130 (general database) may receive a construction planning instruction of urban charging pile issued by the service platform 120, and the management platform 130 (general database) may upload the construction planning scheme of urban charging pile to the service platform.

The sensor network platform 140 may be a functional platform that manages sensor communications. In some embodiments, the sensor network platform 140 may connect the management platform 130 and the object platform 150 to realize the functions of sensing communication of perceptual information and sensing communication of control information. In some embodiments, the sensor network platform 140 may include the plurality of sensor network sub-platforms. In some embodiments, the sensor network platform 140 may be configured as a communication network and a gateway, and each sensor network sub-platform may be configured as an independent gateway.

In some embodiments, the sensor network platform 140 may employ an independent layout. The independent layout may refer to that the sensor network platform 140 includes a plurality of independent sensor network sub-platforms, and the plurality of sensor network sub-platforms operate and process data independently of each other, and directly perform data interaction with the management platform 130 and the object platform 150. In some embodiments, each sensor network sub-platform may upload the data related to the charging pile to the corresponding management sub-platform.

In some embodiments, the plurality of sensor network sub-platforms included in the sensor network platform 140 may be determined according to a preset region in the city, the sensor network sub-platforms may correspond to the management sub-platforms of the management platform 130. For example, the sensor network platform 140 may set a sensor network sub-platform of region A, a sensor network sub-platform of region B, and a sensor network sub-platform of region C, which respectively correspond to the management sub-platform of region A, the management sub-platform of region B, and the management sub-platform of region C.

In some embodiments, in response to the query instruction issued by the sub-platform of the management platform 130, the sensor network platform 140 may obtain the data related to the charging pile from the corresponding region in the object platform 150 through the corresponding sensor network sub-platform and upload the data related to the charging pile to a corresponding management sub-platform of the management platform 130.

In some embodiments, the sensor network platform 140 may interact with the object platform 150. The sensor network sub-platform may obtain the relevant information of the charging piles deployed in various urban regions in the object platform. For example, the sensor network sub-platform may receive the relevant information of the charging piles in each region uploaded by the object platform 150, and issue an instruction for obtaining the relevant information of the charging piles in each region to the object platform. The sensor network platform 140 may interact with the management platform 130. For example, the sensor network platform 140 may receive the instruction for obtaining the relevant information of the charging piles in each region issued by the management platform 130. As another example, the sensor network platform may upload the relevant information of the charging piles in the corresponding region of each object sub-platform to each corresponding management sub-platform. The sensor network sub-platforms may be similar to a plurality of management sub-platforms and divided according to the urban region. A plurality of management sub-platforms may correspond to the sensor network sub-platforms one by one.

The object platform 150 may be a functional platform for generating perception information. In some embodiments, the object platform 150 may be configured to include at least one charging pile. The charging pile is equipped with a unique identification, which may be used to control the charging piles deployed in different regions of the city. The charging pile may also include other auxiliary devices, such as a positioning device, a camera device, or the like. In some embodiments, the object platform 150 may send the obtained relevant information of the charging piles in the target region to the sensor network platform 140.

In some embodiments, the plurality of object sub-platforms included in the object platform 150 may be determined according to charging piles in a preset region of the city, which may correspond to the sensor network sub-platforms of the sensor network platform 140. For example, the object platform 150 may set an object sub-platform of the region A, an object sub-platform of the region B, and an object sub-platform of the region C, which may respectively correspond to the sensor network sub-platform of the region A, the sensor network sub-platform of the region B, and the sensor network sub-platform of the region C.

In some embodiments, the object platform 150 may interact with the sensor network platform 140. For example, the object platform 150 may receive an instruction for obtaining data related to charging piles issued by the sensor network platform 140 (the sensor network sub-platform). The object platform 150 may upload the data related to charging piles to the corresponding sensor network platform 140 (the sensor network sub-platform).

Figure 2:
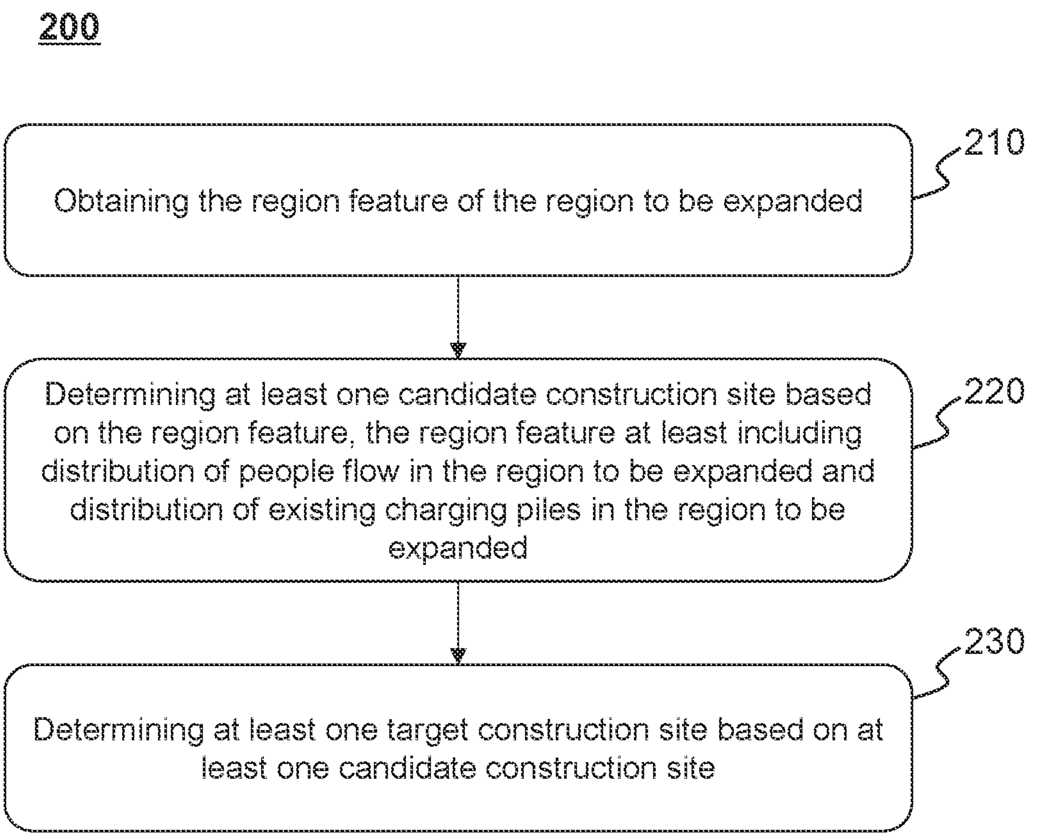
FIG. 2 is a flowchart illustrating an exemplary process of a method for construction planning of charging pile in a smart city according to some embodiments of the present disclosure.

FIG. 2 is a flowchart illustrating an exemplary process of a method for construction planning of the charging pile in a smart city according to some embodiments of the present disclosure. As shown in FIG. 2, process 200 includes the following steps. In some embodiments, process 200 may be performed by the management platform 130.

Step 210: obtaining the region feature of the region to be expanded.

The region to be expanded refers to the relevant region in the city where charging piles needs to be expanded and constructed. For example, the region to be expanded may be a region with a parking lot, such as a hospital region, a supermarket region, a school region, a residential building/community region, or the like.

The region feature refers to the relevant distribution that may reflect the region feature. In some embodiments, the region feature may at least include the distribution of people flow in the region to be expanded and the distribution of existing charging piles in the region to be expanded. The distribution of people flow refers to the distribution of people passing through the region to be expanded in a certain period of time. For example, the distribution of people flow in the region to be expanded may be the distribution of monthly average people flow, the distribution of average annual people flow, etc. For example, the distribution of average monthly people flow in the region to be expanded is 14,000 people, and the distribution of average annual people flow in the region to be expanded is 4 million people, etc. The distribution of existing charging piles refers to the distribution of charging piles that have been established in the region to be expanded. For example, the distribution of existing charging piles in the region to be expanded may be 30 existing charging piles in the school region, 100 existing charging piles in a community commercial complex region, etc., or the distribution of existing charging piles in the region to be expanded may be 20 existing charging piles in the eastern region, and 50 existing charging piles in the western region.

In some embodiments, the region feature may also include distribution of economic level in the region to be expanded.

The distribution of economic level refers to the distribution of economic in the region to be expanded in different time periods or the distribution of economic of different sub-regions of the region to be expanded at the same time. The distribution of economic level may include a distribution of the gross domestic product (GDP), distribution of resident income, etc. For example, the distribution of resident income may be the monthly average resident income distribution, the annual average resident income distribution, or the like.

In some embodiments, the region feature may also include traffic convenience of the region to be expanded.

Traffic convenience refers to the accessibility of transportation in the region to be expanded. The determining factors of traffic convenience may include the factors of municipal public facilities, the factors of secondary disasters, the factors of electric power resources, etc. For example, traffic convenience of the region to be expanded close to municipal public facilities such as roads, traffic, and fire protection is relatively high; the traffic convenience of the region to be expanded far away from the low-lying, water-prone, and secondary disaster-prone places is relatively high; and the traffic convenience of the region to be expanded close to the power grid is relatively high because the region to be expanded has the advantages of easy access to power resources and convenient line laying.

In some embodiments, the region feature may be obtained through government agencies. For example, people flow may obtain from departments such as the Bureau of Statistics; the existing charging piles may be obtained from departments such as the Construction Bureau; the economic level may be obtained from departments such as the Bureau of Statistics; and traffic convenience may be obtained from the Transportation Bureau, Electric Power Bureau, Surveying and Mapping Bureau, Construction Bureau, and other departments.

Step 220: determining at least one candidate construction site based on the region feature.

The candidate construction site refers to the candidate location for the construction of the charging pile in the region to be expanded. For example, the candidate construction site may be a location in the region to be expanded with a lot of people flow, few existing charging piles, a high economic level, and convenient traffic.

In some embodiments, at least one candidate construction site may be determined based on a similarity of the region feature vector with the historical region feature vector in the database. For example, the management platform 130 may construct a corresponding region feature vector based on the region feature of the region to be expanded. The region feature vector refers to a vector constructed based on the region feature information of the region to be expanded. The region feature vector may be constructed by various methods based on the region feature information. For example, the region feature vector p(x, y, m, n) is constructed based on the region feature of the region to be expanded, where the region feature vector p(x, y, m, n) may represent that the people flow in the region to be expanded corresponding to the road segment is x, the existing charging piles in the region to be expanded are y, the economic level distribution of the region to be expanded is m, and the traffic convenience of the region to be expanded is n.

The database includes a plurality of historical region feature vectors, and a construction site corresponding to each historical region feature vector in the plurality of historical region feature vectors. The historical region feature vector is constructed based on the region feature information corresponding to the historical region, and the historical construction site corresponding to the historical region feature vector may be an actual construction site of the historical region.

In some embodiments, the management platform 130 may calculate the distance between the historical region feature vector and the region feature vector of the region to be expanded, and determine the candidate construction sites of the region to be expanded. For example, the historical region feature vector whose vector distance from the region feature vector of the region to be expanded satisfies the preset condition as the target region feature vector, and use the construction site in the historical region corresponding to the target region feature vector as the candidate construction site in the region to be expanded. The preset condition may be set according to the situation. For example, the vector distance is the smallest, or the vector distance is less than the distance threshold, etc.

Step 230: determining at least one target construction site based on at least one candidate construction site.

The target construction site refers to a target location in the region to be expanded where the charging pile is constructed. For example, the target construction site may be a location in the region to be expanded with a lot of people flow and few existing charging piles, or a location with a high economic level and convenient transportation, or a combination of the above.

In some embodiments, the management platform 130 may determine at least one target construction site based on at least one candidate construction site in various ways.

For example, the management platform may manually determine at least one target construction site based on at least one candidate construction site according to historical experience. As another example, at least one candidate construction site may be randomly selected from the candidate construction sites as the target construction site.

In some embodiments, the management may determine at least one target construction site through processing the site feature of each candidate construction site in at least one candidate construction site based on a first prediction model. For more descriptions for the first prediction model and the determination of at least one target construction site, please refer to FIG. 3 and its related descriptions.

According to some embodiments of the present disclosure, the method for construction planning of charging pile may obtain at least one candidate construction site based on the region feature, and determine at least one target construction site and determine the appropriate construction site of charging pile, which may not only improve the user's travel and use experience, but also improve the utilization rate and revenue of the charging pile.

It should be noted that the above description of process 200 is only for example and explanation, and does not limit the scope of application of the present disclosure. For those skilled in the art, various modifications and changes may be made to the process under the guidance of the present disclosure. However, these corrections and changes are still within the scope of the present disclosure.

Figure 3:
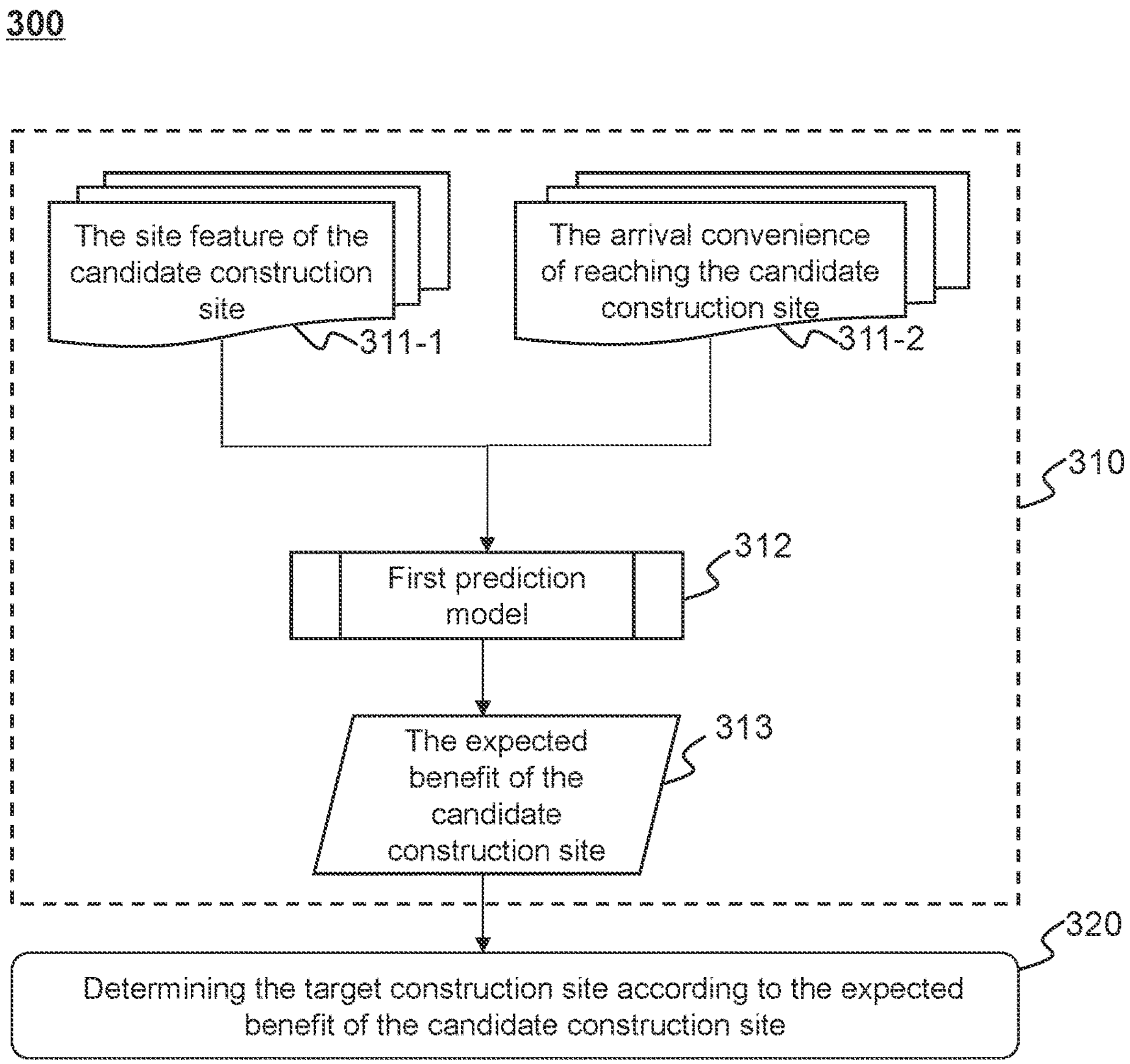
FIG. 3 is a flowchart illustrating an exemplary process for determining a target construction site according to some embodiments of the present disclosure.

FIG. 3 is a flowchart illustrating an exemplary process for determining a target construction site according to some embodiments of the present disclosure. As shown in FIG. 3, process 300 includes the following steps. In some embodiments, process 300 may be executed by the management platform 130.

Step 310: predicting the expected benefit 313 of the candidate construction site through processing a site feature of each candidate construction site in at least one candidate construction site based on the first prediction model 312. The first prediction model may be a machine learning model.

In some embodiments, the input of the first prediction model 312 may be the site feature 311-1 of the candidate construction site, and the output of the first prediction model may be the expected benefit 313 of the candidate construction site.

The site feature 311-1 refers to the relevant feature information of the candidate construction site. In some embodiments, the site feature 311-1 may include traffic convenience, economic level, total population, etc. of the region where the candidate construction site is located. For example, the site feature 311-1 may be represented by a site feature vector, such as a site feature vector q(a, b, c) constructed based on the site features of the candidate construction sites, where the site feature vector q(a, b, c) may indicate that the traffic convenience of the candidate construction site is a, the economic level of the candidate construction site is b, and the total population of the candidate construction site is c.

In some embodiments, the site feature 311-1 may further include the number of large facilities around the candidate construction site and the corresponding people flow. For example, the number of large hospitals around a candidate construction site is 3, and the corresponding monthly average people flow is 10,000, 15,000, and 20,000 respectively.

In some embodiments, the site feature of the candidate construction site may be represented by a vector. For example, the site feature of site 1 may be expressed as (a, b, c, d, e, f), where a, b, c, d, e, and f may respectively represent a feature factor, the values of a, b, c, d, e, and f represent the feature values corresponding to the corresponding feature factors. For example, the traffic convenience of the candidate construction site is a, the economic level of the candidate construction site is b, and the total population of the candidate construction site is c, the type of large facilities at the candidate construction site is d, the number of large facilities around the candidate construction site is e, and the people flow corresponding to the large facilities around the candidate construction site is f.

The expected benefit 313 of the candidate construction site refers to the related effect profit of the candidate construction site in a certain future time period or the value of the factor affecting the profit of the charging pile. For example, the expected benefit of the candidate construction site may include electric vehicle flows at the candidate construction site. Electric vehicle flow refers to the flow of electric vehicles in a certain period of time. For example, electric vehicle flow may be 8,000 vehicles/day, or 120,000 vehicles/month, etc.

The parameters of the first prediction model 312 may be obtained through training. In some embodiments, the first prediction model 312 may be obtained by training based on a plurality of training samples with labels. For example, a plurality of training samples with labels may be input into an initial first prediction model, a loss function may be constructed by using the labels and the output of the initial first prediction model, and the parameters of the first prediction model 312 may be iteratively updated based on the loss function. When the loss function of the initial first prediction model satisfies the preset condition, the model training is completed, and the trained first prediction model 312 is obtained. The preset condition may be that the loss function converges, the number of iterations reaches a threshold, or the like.

In some embodiments, the training samples may include site features of a plurality of sample construction sites (e.g., traffic convenience data, economic level data, total population data, data on the number of large facilities, data on corresponding people flow, etc.). The label may be the actual benefit of the construction site (e.g., actual electric vehicle flow, etc.). In some embodiments, the training samples may be obtained based on historical construction sites, and the labels may be obtained by manual labeling.

In some embodiments, the input of the first prediction model 312 further includes the arrival convenience 311-2 of reaching the candidate construction site from the preset site.

The preset site refers to each high-flow facility. The high-flow facility may be a facility where the people flow exceeds a preset flow threshold. For example, the preset site may be a hospital, shopping mall, parking lot, etc., where the people flow exceeds the preset flow threshold.

Arrival convenience 311-2 refers to the convenience between the candidate construction site and the preset site. Arrival convenience 311-2 may be represented by the average spending time. The average spending time may be obtained through the management platform of the Internet of Things system associated with the navigation system of each vehicle in the city. The spending time may be calculated using the time of "navigating to the candidate construction site" as the starting point of time and "completing charging" as the end point of time. Through a large number of statistics on the spending time from the same preset site to the candidate construction site, the spending time between the candidate construction site and the preset site may be obtained. Based on this method, the spending time between the candidate construction site and different preset sites may be further obtained, the average spending time between the candidate construction site and the preset site may be obtained, and then the arrival convenience of reaching the candidate construction site may be obtained based on the average spending time between the candidate construction site and the preset site.

In some embodiments, the arrival convenience 311-2 may be expressed by a numerical value or a percentage. For example, the average spending time for hospital A to reach the candidate construction site X is 20 minutes, the average spending time for the shopping mall B to reach the candidate construction site X is 30 minutes, and the average spending time for the school C to reach the candidate construction site X is 40 minutes, then it may be considered that the average spending time for the preset site to reach the candidate construction site X is 30 minutes, and the corresponding arrival convenience 311-2 may be expressed as 70%.

Figure 4:
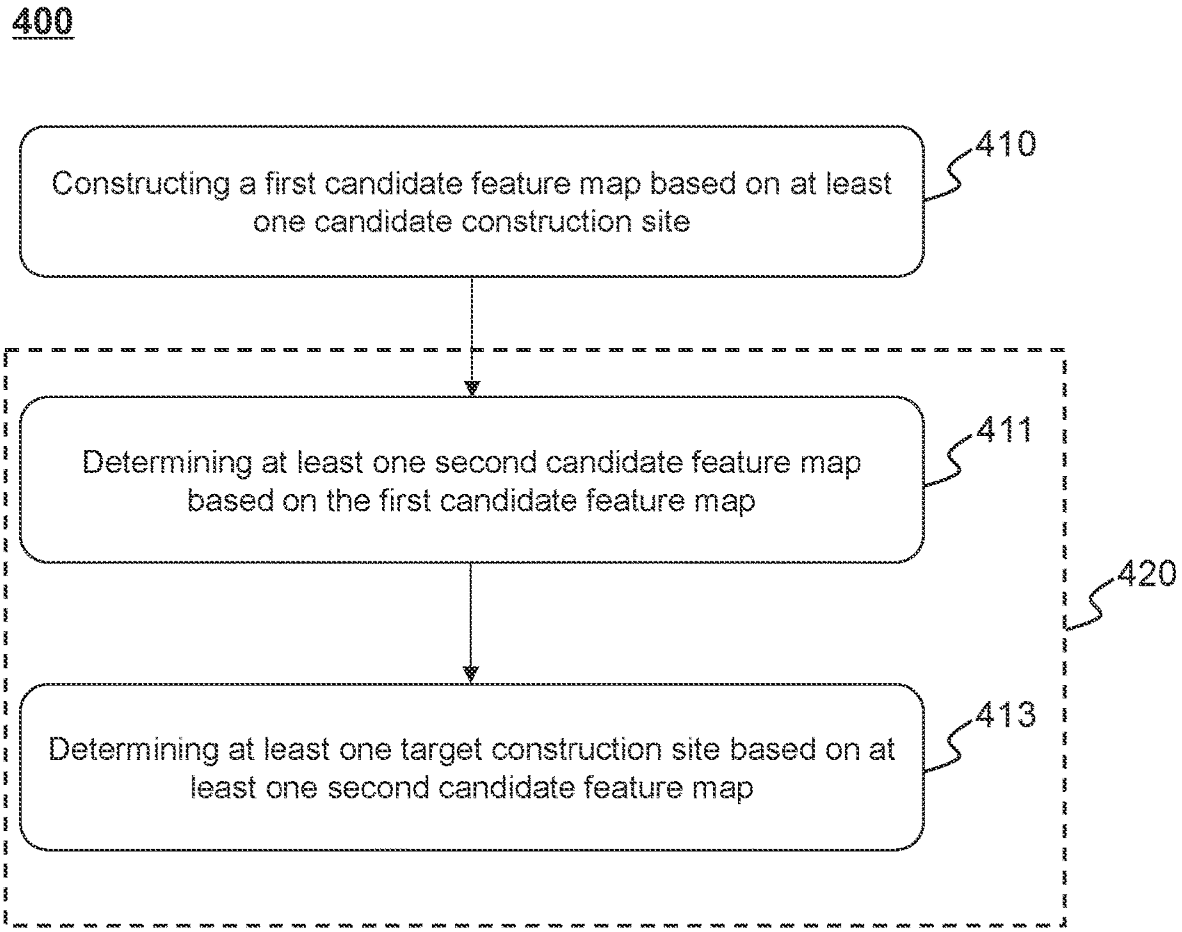
FIG. 4 is a flowchart illustrating an exemplary process for determining at least one target construction site according to some embodiments of the present disclosure.

For more explanations about arrival convenience, please see FIG. 4 and its related descriptions.

According to some embodiments of the present disclosure, the input of the first prediction model also includes the arrival convenience of reaching the candidate construction site from the preset site, which may better judge the future benefits of charging piles through the influence of the preset site.

Step 320: determining the target construction site according to the expected benefit of the candidate construction site.

In some embodiments, the management platform 130 may determine the target construction site according to the expected benefit of the candidate construction site in various ways.

For example, the target construction site may be determined manually based on the expected benefits of the candidate construction site. For example, a site with the largest flow of electric vehicles or the flow of electric vehicles greater than a preset expected benefit threshold may be determined as the target construction site. If the preset expected benefit threshold is 120,000 vehicles/month, the site where the flow of electric vehicles is greater than 120,000 vehicles/month may be determined as the target construction site.

According to some embodiments of the present disclosure, the expected benefit of the candidate construction site may be predicted by processing the site feature of each candidate construction site in at least one candidate construction site based on the first prediction model, which may judge more intuitively the benefit of candidate construction sites. The target construction sites may be automatically determined based on the expected benefits of the candidate construction sites, so as to improve the accuracy of the determination of the target construction sites.

FIG. 4 is a flowchart illustrating an exemplary process for determining at least one target construction site according to some embodiments of the present disclosure. As shown in FIG. 4, process 400 includes the following steps.

Step 410: constructing a first candidate feature map based on at least one candidate construction site.

The first candidate feature map may be graph-structured data composed of nodes and edges, and the edges connect nodes, and the nodes and edges may have attributes.

Figure 5:
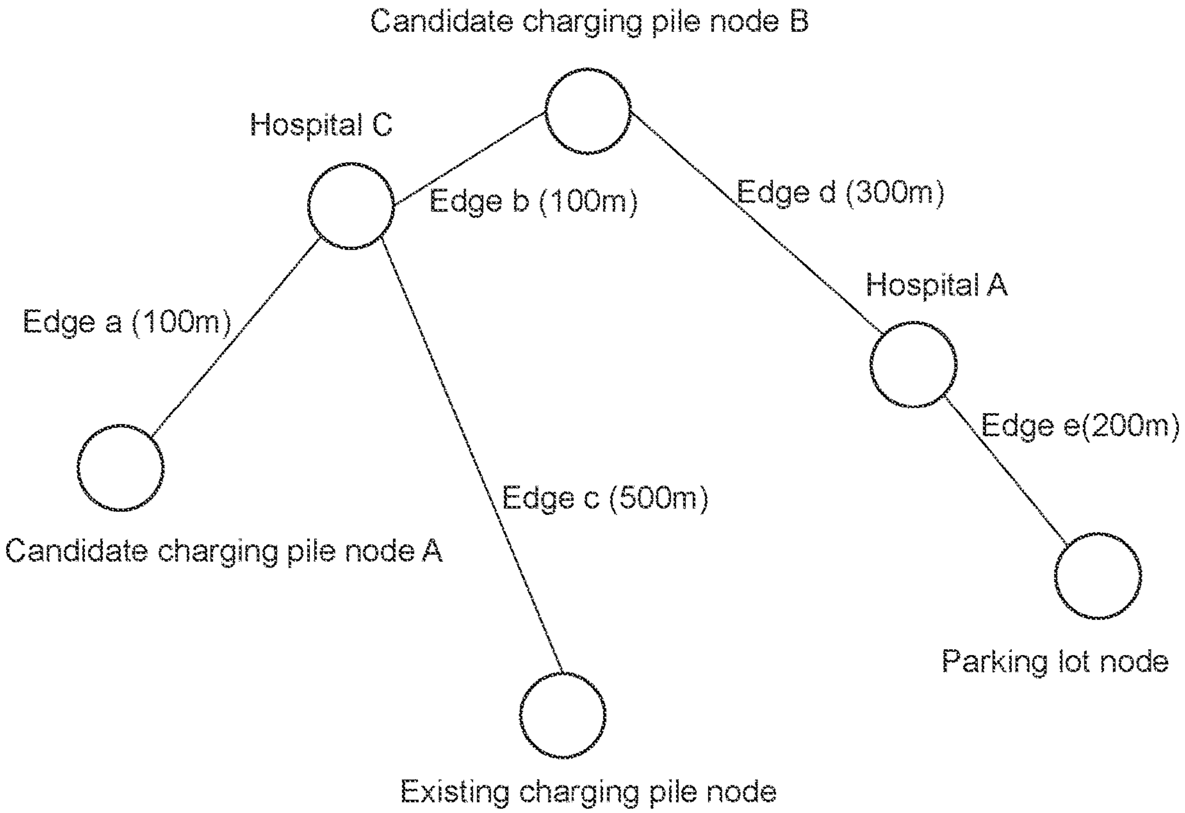
FIG. 5 is a schematic diagram of a first candidate feature map according to some embodiments of the present disclosure.

FIG. 5 is a schematic diagram of a first candidate feature map according to some embodiments of the present disclosure.

In some embodiments, the first candidate feature map may include a first node, a second node, and a third node. The first node may be a candidate construction site node, the second node may be a constructed site node, and the third node may be an important facility node. The constructed site may refer to the site where the charging pile has been constructed in the region to be expanded. Important facilities may refer to public places in the region to be expanded that meet a preset condition. The preset condition may be that the people flow is not less than the flow threshold or the nature of the place falls within the preset range. For example, important facilities may be hospitals, large shopping malls, parking lots, etc. As an example only, as shown in FIG. 5, the first candidate feature map may include a first node a, a first node b, a second node a, a third node a, a third node b, and a third node c. The first node a and the first node b respectively correspond to the candidate charging pile node A and the candidate charging pile node B in FIG. 5. The second node a corresponds to the existing charging pile node. The third node a, the third node b, and the third node c correspond to the hospital A, the parking lot node, and the hospital C, respectively.

In some embodiments, the first node may correspond to the candidate construction site. The attribute of the first node may reflect the relevant features of the candidate construction site. For example, the attributes of the first node may include economic level. The economic level may refer to the economic development level of the region where the candidate construction site is located. The economic level may be determined based on the distance from the city center to the region where the candidate construction site is located, the housing price level of the region where the candidate construction site is located, etc. For example, the economic level may be determined by the weighted summation of the reciprocal of the distance from the city center to the region where the candidate construction site is located and the housing price level of the region where the candidate construction site is located. The distance between the region where the candidate construction site is located and the city center and the housing price level information of the region where the candidate construction site is located may be obtained from the government statistics bureau and other departments through the management platform.

In some embodiments, the economic level may be used to predict the number of electric vehicles in the region where the corresponding candidate construction site is located further to determine the number of charging piles in the candidate construction site. For example, the number of electric vehicles in the region where the candidate construction site is located and the number of charging piles in the candidate construction site may be positively related to the economic level of the region.

In some embodiments, the second node may correspond to the constructed site. The attributes of the second node may reflect the relevant features of the constructed site. For example, the attributes of the second node may include economic level, people flow, and income. The people flow may be the monthly average people flow or the average annual people flow at the constructed site corresponding to the node. The income may be the monthly average income or the average annual income of the region where the constructed site corresponding to the node is located.

In some embodiments, the third node may correspond to the important facility within the region. The attributes of the third node may reflect the relevant features of important facilities. For example, the attributes of the third node may include the people flow and the scale of facilities. The people flow may be the monthly average people flow or the average annual people flow in the important facilities corresponding to the node. The scale of facilities may refer to the area or construction area of important facilities.

In some embodiments, the edges in the first candidate feature map correspond to the road between the candidate construction site and the constructed site and the road between the candidate construction site and important facilities. The edges in the first candidate feature map may correspond to the shortest road between the two connected nodes, and the edge attribute may be the length of the corresponding road. For example, as shown in FIG. 5, the first candidate feature map may include edge a, edge b, edge c, edge d, and edge e.

In some embodiments, the attributes of the edge may further include the arrival convenience of the road corresponding to the edge.

In some embodiments, the arrival convenience may be represented in the form of vector. For example, the arrival convenience vector of a certain road may be (3, 5), where the element "3" represents that the number of turns on the road is 3, and the element "5" represents that the number of traffic lights on the road is 5. For other explanations about the arrival convenience, please refer to FIG. 3 and its corresponding description.

In some embodiments, the arrival convenience may include the average spending time. The spending time may also refer to the time spent by an electric vehicle passing through the road corresponding to a certain edge from one node connected to the edge to the other node connected to the edge. The average spending time may refer to the average of the spending time about a plurality of charges of a large number of electric vehicles in the region to be expanded. The spending time may be obtained through the management platform associated with the navigation system of each electric vehicle in the city. For more explanations of spending time, please see FIG. 3 and its corresponding description.

In some embodiments of the present disclosure, the arrival convenience and the spending time may be introduced as attributes of the edges of the first candidate feature map, causing that the first candidate feature map may better reflect the charging demand features of electric vehicles in the region to be expanded.

In some embodiments of the present disclosure, the target construction site may be determined by constructing the map structure data, causing that the selection of the target construction site may refer to the features of the relevant facilities or places, so that the determined target construction site is more in line with the needs of electric vehicle users.

Step 420: determining at least one target construction site based on the first candidate feature map.

In some embodiments, the management platform may predict the estimated electric vehicle flows and the estimated average queuing time of each first node through the second prediction model. The second prediction model may be a graph neural network (GNN) model. The input of the second prediction model may be the first candidate feature map, and the output of the second prediction model may include the estimated average queuing time and the estimated electric vehicle flows of the candidate construction sites corresponding to all the first nodes in the first candidate feature map. The output of the second prediction model may be obtained based on the output of the node. The estimated electric vehicle flows may be characterized by an estimated monthly average flow or an average annual flow.

In some embodiments, the second prediction model may be trained by a plurality of training samples with labels. For example, a plurality of training samples with labels may be input into an initial second prediction model, a loss function may be constructed by using the labels and the results of the initial second prediction model, and parameters of the initial second prediction model may be iteratively updated based on the loss function. When the loss function of the initial second prediction model satisfies the preset condition, the model training is completed, and the trained second prediction model is obtained. The preset conditions may be that the loss function converges, the number of iterations reaches a threshold, or the like.

In some embodiments, the training sample of the second prediction model may be a historical feature map generated based on historical charging site data, and the label may be the electric vehicle flow and average queuing time after the charging site in the historical feature map is put into use.

In some embodiments, step 420 may include the following steps.

Step 411: determining at least one second candidate feature map based on the first candidate feature map.

The second candidate feature map may refer to a candidate feature map obtained by performing certain modifications on the first candidate feature map.

In some embodiments, the management platform may determine the second candidate feature map based on the output of the second prediction model. For the relevant description of the second prediction model, please refer to the foregoing description. Further, at least part of the first nodes that meet preset node condition in the first candidate feature map may be retained, the remaining first nodes and corresponding edges may be deleted, and then a second candidate feature map may be obtained based on the modified first candidate feature map, and the preset node condition may be that the expected average queuing time does not exceed a time threshold, and the expected electric vehicle flow is not lower than a preset flow threshold. For example, for the first candidate feature map shown in FIG. 5, the first node a and edge a may be deleted, and the remaining part of the first candidate feature may be used as a second candidate feature map.

Step 413: determining at least one target construction site based on at least one second candidate feature map.

In some embodiments, candidate construction sites corresponding to all the first nodes in the second candidate feature map may be used as target construction sites.

In some embodiments, at least one target construction site may be determined by other methods. For more details, please refer to FIG. 6 and its related descriptions.

In some embodiments of the present disclosure, the target construction site may be determined by improving the candidate feature map, which may avoid the occurrence of insufficient vehicle flow or long queuing time at the determined construction site while meeting the needs of electric vehicle users.

In some embodiments of the present disclosure, the target construction site may be determined by constructing and improving the map structure data, causing that the determined construction site may be more in line with the needs of electric vehicle users and have higher benefits.

Figure 6:
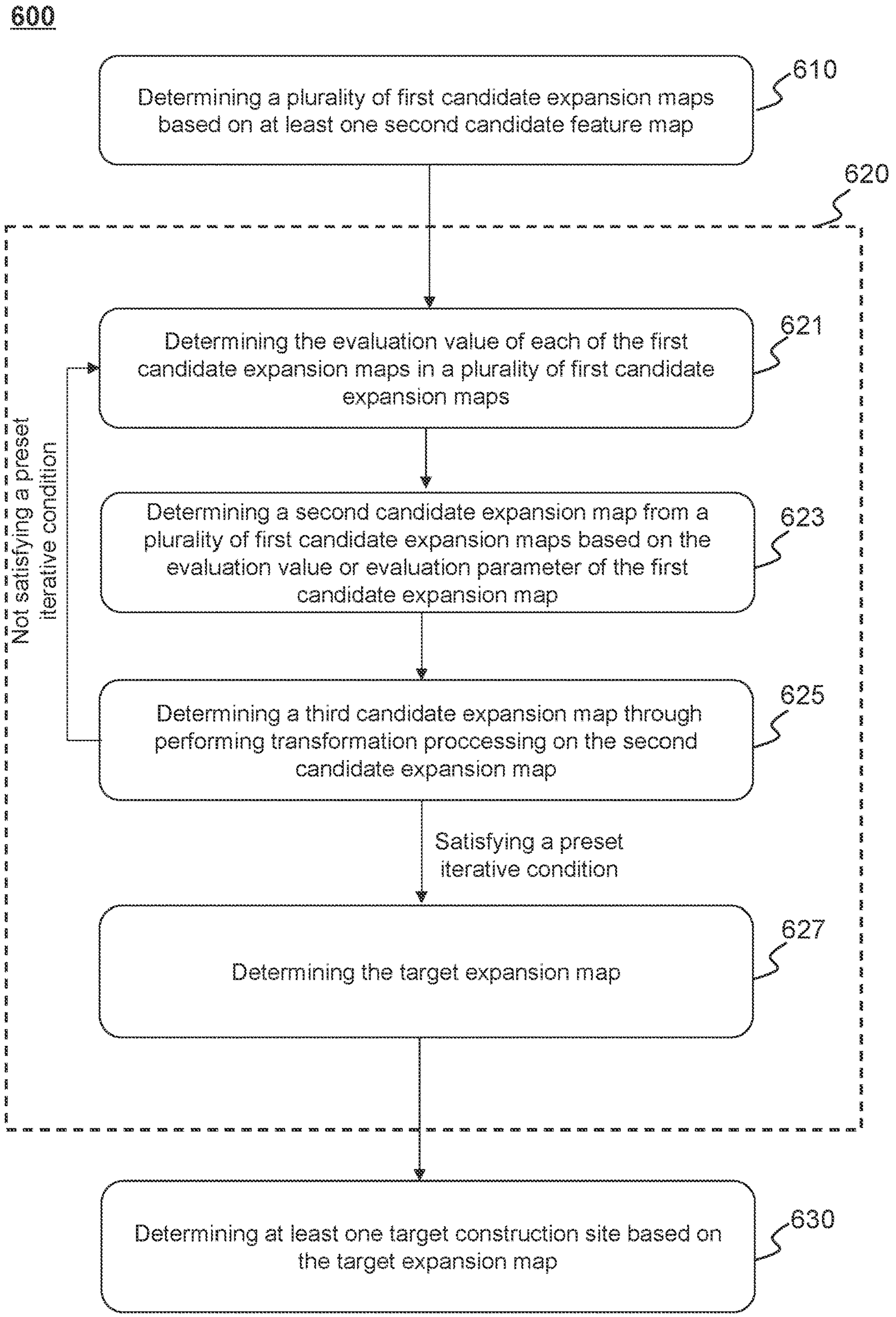
FIG. 6 is a flowchart illustrating another exemplary process for determining at least one target construction site according to some embodiments of the present disclosure.

FIG. 6 is a flowchart illustrating another exemplary process for determining at least one target construction site according to some embodiments of the present disclosure. As shown in FIG. 6, process 600 includes the following steps.

Step 610: determining a plurality of first candidate expansion maps based on at least one second candidate feature map.

The first candidate expansion map may refer to the map structure data determined based on the second candidate feature map, which may be used for subsequent determination of the target construction site.

In some embodiments, at least one second candidate feature map may be used as at least one first candidate expansion map.

Step 620: determining a target expansion map through performing a plurality of rounds of iteration updates on a plurality of first candidate expansion maps until a preset iterative condition is satisfied.

In some embodiments, the method for a plurality of rounds of iteration updates may be to modify a plurality of first candidate expansion maps in each round of iteration. The modification method may include, but is not limited to, adding/deleting operations on nodes or edges in the first candidate expansion map, or modifying attributes of nodes or edges, or the like. The way of modification may be a manual selective modification or a random modification. The preset iterative condition may be that the number of iterations reaches a preset number threshold, or the like. For more descriptions of preset iteration conditions, please refer to elsewhere in the present disclosure.

In some embodiments, each of the plurality of rounds of iteration updates in step 620 may include the following steps.

Step 621: determining the evaluation value of each first candidate expansion map in a plurality of first candidate expansion maps.

The evaluation value may be a comprehensive evaluation result of the total expected revenue and the total estimated average queuing time of the candidate construction sites corresponding to all the candidate construction site nodes in the first candidate expansion map. The total expected revenue refers to the sum of the expected revenue of all candidate construction sites in the first candidate expansion map. The total estimated average queuing time refers to the sum of the estimated average queuing time of all candidate construction sites in the first candidate expansion map. The larger the evaluation value of the first candidate expansion map is, the better the overall performance of the total expected revenue and the total estimated average queuing time of the candidate construction sites corresponding to all candidate construction site nodes in the first candidate expansion map is. For the description of the expected revenue and the estimated average queuing time, please refer to FIG. 3, FIG. 4, and their related descriptions.

In some embodiments, the evaluation value of the first candidate expansion map may be positively related to the total expected revenue and negatively related to the total estimated average queuing time. For example, the evaluation value may be calculated by the following equation (1):

$$P = y + \frac{k}{t} \tag{1}$$

where P represents the evaluation value; y represents the total expected revenue; t represents the total estimated average queuing time; and k is a constant whose value may be preset manually.

In some embodiments, the evaluation value of the first candidate expansion map may also be positively related to a weighted summation of expected revenues of a plurality of candidate construction site nodes in the first candidate expansion map. For example, the evaluation value may be calculated by the following equation (2):

$$P = \sum_{i=1}^{N} m_i y_i \tag{2}$$

where P represents the evaluation value; N represents the number of candidate construction site nodes in the first candidate expansion map; $m_i$ represents the weight coefficient of the ith candidate construction site node, which may be preset manually; and $y_i$ represents the expected revenue of the ith candidate construction site node.

In some embodiments, the weight coefficient of each candidate construction site node in equation (2) may be related to the arrival convenience of the node to its nearest important facility node or an important facility node with a people flow greater than a people flow threshold. For example, the weight coefficient of each candidate construction site node is negatively related to the arrival convenience of the node to its nearest important facility node or an important facility node with a people flow greater than a people flow threshold. The people flow of important facility nodes may be obtained from the city monitoring system through the management platform. The people flow threshold may be preset.

In some embodiments of the present disclosure, the evaluation value may be correlated with the expected revenue of each candidate construction site, causing that the obtained evaluation value may well reflect the advantages and disadvantages of the corresponding first candidate expansion map.

In some embodiments of the present disclosure, the evaluation value may be correlated with the total expected revenue and total queuing time of the candidate construction sites, causing that the obtained evaluation value may better reflect the advantages and disadvantages of the corresponding first candidate expansion map.

Step 623: determining a second candidate expansion map from a plurality of first candidate expansion maps based on the evaluation value or evaluation parameter of the first candidate expansion map.

The evaluation parameter may refer to a parameter that characterizes the probability of each first candidate expansion map subsequently used to determine the second candidate expansion map. The larger the parameter value of the evaluation parameter is, the greater the possibility of the corresponding first candidate expansion map used to determine the second candidate expansion map is. In some embodiments, the evaluation parameter of the first candidate expansion map may be positively related to its evaluation value. That is, the larger the evaluation value of the first candidate expansion map is, the higher the possibility that the first candidate expansion map is selected for determining the second candidate expansion map is.

In some embodiments, the evaluation parameters of the first candidate expansion map may be determined based on operators such as roulette. For example, the ratio of the area of the corresponding region of each first candidate expansion map to the area of the roulette region in the roulette may be calculated by the following equation (3):

$$X_j = \frac{P_j}{\sum_{i=1}^{A} P_i} \times 100\% \tag{3}$$

where $X_i$ represents the ratio of the area of the region corresponding to the jth first candidate expansion map to the area of the roulette region; $P_j$ and $P_i$ represent the evaluation values of the jth and ith first candidate expansion maps, respectively;

$$\sum_{i=1}^{A} P_i$$

represents the sum of the evaluation values of all the first candidate expansion maps; and A represents the total number of first candidate expansion maps. Further, the value of $X_j$ may be used as an evaluation parameter of each first candidate expansion map.

In some embodiments, the evaluation parameters of the first candidate expansion map may also be determined based on other methods. For example, a first candidate expansion map may have candidate construction site nodes with high expected revenue but large estimated average queuing time. In this case, the evaluation parameter of the first candidate expansion map may be appropriately increased, and the range of the increase may be preset manually. The high expected revenue may mean that the expected revenue is greater than an expected revenue threshold. The large estimated average queuing time may mean that the estimated average queuing time is greater than a time threshold. Both the expected revenue threshold and the time threshold may be preset manually.

In some embodiments, a first candidate expansion map may have candidate construction site nodes that do not meet a preset selection condition. At this time, the evaluation parameter of the first candidate expansion map may be appropriately reduced, and the range of reduction may be preset manually. The candidate construction site nodes that do not meet the preset selection condition may include candidate construction site nodes far away from the power supply device, candidate construction site nodes located in regions where vehicles are prohibited from entering, etc.

The second candidate expansion map may refer to the map structure data screened from the first candidate expansion map and used for subsequent determination of the target construction site.

In some embodiments, the first candidate expansion map whose evaluation value is greater than a first evaluation threshold may be used as the second candidate expansion map. The first evaluation threshold may be preset.

In some embodiments, the first candidate expansion map whose evaluation parameter is greater than an evaluation parameter threshold may be used as the second candidate expansion map. The evaluation parameter threshold may be preset.

Step 625: determining a third candidate expansion map through performing transformation processing on the second candidate expansion map.

The third candidate expansion map may refer to map structure data obtained by performing transformation processing on the second candidate expansion map and used for subsequent determination of the target construction site.

In some embodiments, the transformation process may refer to an operation of modifying, adding or deleting, etc., nodes or edges in the second candidate expansion map. For example, a certain node and its corresponding edge may be deleted in the second candidate expansion map, and the modified second candidate expansion map may be used as the third candidate expansion map.

In some embodiments, the transformation process may include a first transformation and a second transformation.

The first transformation may refer to selecting at least two second candidate expansion maps from a plurality of second candidate expansion maps, exchanging one or more nodes in the selected at least two second candidate expansion maps to generate at least two candidate maps, and a third candidate expansion map is determined based on the at least two candidate maps. For example, the candidate map may be directly used as the third candidate expansion map.

In some embodiments, a second candidate expansion map that meets a preset selection rule may be selected for performing the first transformation. The preset selection rule may be that the evaluation value of the second candidate expansion map is larger than the first evaluation threshold and/or the evaluation parameter is larger than the evaluation parameter threshold. For related descriptions of the first evaluation value threshold and the evaluation parameter threshold, please refer to the foregoing related descriptions.

Exchanging one or more nodes in the selected at least two second candidate expansion maps may be understood as selecting one or more candidate construction site nodes in at least two second candidate expansion maps, and the selected candidate construction site nodes existing only in the second candidate expansion map, and then exchanging the selected one or more candidate construction site nodes with the candidate construction site nodes selected by other second candidate expansion maps.

Exemplarily, the exchange method may be: deleting the candidate construction site node a and the edge connected to the node a in the second candidate expansion map A; deleting the candidate construction site node b and the edge connected to the node b in the second candidate expansion map B; creating a new candidate construction site node a' that is exactly the same as the candidate construction site node a in the second candidate expansion map B, and constructing corresponding edges with other nodes which are connected with the candidate construction site node a by roads; creating a new candidate construction site node b' that is exactly the same as the candidate construction site node b in the second candidate expansion map A, and constructing corresponding edges with other nodes which are connected with candidate construction site node b by roads; and then two candidate maps may be obtained based on the aforementioned transformation.

The second transformation may refer to deleting and/or adding nodes in a preliminary map to generate at least one third candidate expansion map. The preliminary map is the second candidate expansion map or the candidate map generated by the second candidate expansion map through the first transformation.

In some embodiments, the second candidate expansion map or candidate map that meets the preset selection rule may be selected to perform the second transformation. The preset selection rule may be that the evaluation value of the second candidate expansion map or the candidate map is larger than the first evaluation threshold and/or the evaluation parameter is larger than the evaluation parameter threshold. For related descriptions of the first evaluation threshold and the evaluation parameter threshold, please refer to the foregoing related descriptions.

Exemplarily, the method for generating the third candidate expansion map may be: deleting the candidate construction site node a and the edges connected to the candidate construction site node a in the second candidate expansion map A; and using the remaining nodes and edges of the second candidate expansion map A as the third candidate expansion map. As another example, the method for generating the third candidate expansion map may be:

candidate construction site nodes a, b, c, and their corresponding edges existing in the original second candidate expansion map A; adding a candidate construction site node d in the original second candidate expansion map A; constructing an edge between the node that is connected to the candidate construction site node d by a road and the candidate construction site node d; and using the second candidate expansion map A after adding the candidate construction site node d and its corresponding edge as the third candidate expansion map.

In some embodiments, the nodes selected in the first transformation and the second transformation may be determined based on the expected revenue of at least one candidate construction site node and the estimated average queuing time of at least one candidate construction site node in the second candidate expansion map. For example, the estimated average queuing time of a candidate construction site node in a second candidate expansion map is large, but its expected revenue is also large, then the possibility of this node being exchanged to other second candidate expansion maps through the first transformation may be high. As another example, the estimated average queue time of a candidate construction site node in a second candidate expansion map is large, and its expected revenue is small, then the possibility of the node being deleted after the second transformation may be high.

In some embodiments, the candidate map generated through the first transformation needs to meet restriction condition. For example, the restriction condition may be that the spatial distance between the candidate construction sites corresponding to any two candidate construction site nodes in the candidate map may be not smaller than a minimum distance threshold. The minimum distance threshold may be preset.

In some embodiments of the present disclosure, the transformation result may be developed in a better direction by limiting the transformation method to a certain extent.

In some embodiments of the present disclosure, a better-quality candidate construction site may be obtained more easily by improving the map structure data of the candidate construction site through various transformation methods.

In some embodiments, the preset iterative condition may include but is not limited to, at least one of the following: the number of rounds of iteration being not less than a preset round value; the evaluation value of the first candidate expansion map being not less than a preset evaluation value; and in at least two consecutive rounds of iteration, the change in the evaluation value of the first candidate expansion map being smaller than a preset change value. For descriptions of the first candidate expansion map and its evaluation value, please refer to the foregoing related description. The preset evaluation value may refer to a second evaluation threshold, which may be preset manually. The change in the evaluation value may refer to the difference between the evaluation values of the first candidate expansion map involved in two adjacent iterations. The preset change value may refer to the difference threshold of the evaluation value, which may be preset manually.

In some embodiments, by setting the above-mentioned preset iterative condition, the waste of resources and costs caused by excessive iteration is avoided while ensuring an excellent degree of iteration results.

In some embodiments, through the above-mentioned iterative method, the map structure data of the determined construction site may well meet the charging needs of electric vehicle users, and at the same time, the construction site of the charging pile may obtain relatively high revenue.

Step 627: determining the target expansion map.

The target expansion map may refer to the map structure data determined based on the third candidate expansion map and used to determine the target construction site.

In some embodiments, the third candidate expansion map obtained in the last round of iteration in the above iteration process may be used as the target expansion map. In some embodiments, the third candidate expansion map with the largest evaluation value in the above iteration process may also be used as the target expansion map.

Step 630: determining at least one target construction site based on the target expansion map.

In some embodiments, the candidate construction site corresponding to the candidate construction site node in the target expansion map may be used as the target construction site.

In some embodiments of the present disclosure, the target construction site may be determined by performing operations such as changes on the map structure data, causing that the determined construction site may have higher revenues and meet the needs of electric vehicle users at the same time.

The basic concepts have been described above, apparently, for those skilled in the art, the above-mentioned detailed disclosure is only used as an example, and does not constitute a limitation of the present disclosure. Although there is no clear explanation here, those skilled in the art may make various modifications, improvements, and corrections for the present disclosure. The amendments, improvements, and amendments are recommended in the present disclosure, so the amendments, improvements, and amendments of this class still belong to the spirit and scope of the demonstration embodiments of the present disclosure.

At the same time, the present disclosure uses specific words to describe the embodiments of the present disclosure. As "one embodiment", "an embodiment", and/or "some embodiments" means a certain feature, structure, or characteristic of at least one embodiment of the present disclosure. Therefore, it is emphasized and should be appreciated that two or more references to "an embodiment" or "one embodiment" or "an alternative embodiment" in various parts of this specification are not necessarily all referring to the same embodiment. In addition, some features, structures, or characteristics of one or more embodiments in the present disclosure may be properly combined.

Moreover, unless the claims are clearly stated, the order of processing elements and sequences of the present disclosure, the use of digital letters, or the use of other names, is not configured to define the order of the present disclosure processes and methods. While the foregoing disclosure discusses by way of various examples some embodiments of the invention presently believed to be useful, it is to be understood that such details are for purposes of illustration only and that the appended claims are not limited to the disclosed embodiments, but rather are intended to cover all modifications and equivalent combinations that fall within the essence and scope of the embodiments of the present disclosure. For example, although the implementation of various components described above may be embodied in a hardware device, it may also be implemented as a software only solution, e.g., an installation on an existing server or mobile device.

Similarly, it should be noted that in order to simplify the expression disclosed in the present disclosure and help the understanding of one or more invention embodiments, in the previous description of the embodiments of the present disclosure, a variety of features are sometimes combined into one embodiment, drawings or description thereof. However, this disclosure method does not mean that the features required by the object of the present disclosure are more than the features mentioned in the claims. Rather, claimed subject matter may lie in less than all features of a single foregoing disclosed embodiment.

Some embodiments use numbers with description ingredients and attributes. It should be understood that the number described by such embodiments is used in some examples with the modified words "about", "approximate" or "generally" to modify. Unless otherwise stated, "about," "approximate," or "substantially" may indicate ±20% variation of the value it describes. Accordingly, in some embodiments, the numerical parameters used in the present disclosure and claims are approximate values, and the approximate values may be changed according to characteristics required by individual embodiments. In some embodiments, the numerical parameters should consider the prescribed effective digits and adopt a general digit retention method. Although the numerical domains and parameters used in the present disclosure are used to confirm its range breadth, in the specific embodiment, the settings of such values are as accurate as possible within the feasible range.

For each patent, patent application, patent application publication, and other material, such as article, book, specification, publication, document, etc., cited in the present disclosure, the entire contents of which are hereby incorporated by reference into the present disclosure. The application history documents that are inconsistent with or conflict with the contents of the present disclosure are excluded, and the documents (currently or hereafter appended to the present disclosure) that limit the broadest scope of the claims of the present disclosure are also excluded. It should be noted that, if there is any inconsistency or conflict between the descriptions, definitions, and/or usage of terms in the accompanying materials of the present disclosure and the contents of the present disclosure, the descriptions, definitions, and/or usage of terms in the present disclosure shall prevail.

Finally, it should be understood that the embodiments described in this manual are only used to illustrate the principle of the embodiments of this description. Other deformation may also belong to the scope of this disclosure. Therefore, as an example rather than restrictions, the replacement configuration of the embodiment of this disclosure may be consistent with the teaching of this disclosure. Accordingly, the embodiments of this disclosure are not limited to those expressly introduced and described in this disclosure.

What is claimed is:

1. A method for construction planning of a charging pile in a smart city, implemented based on a management platform of an Internet of Things (IoT) system for construction planning of the charging pile in the smart city, the IoT system for construction planning of the charging pile in the smart city further comprising a user platform, a service platform, a sensor network platform, and an object platform; the user platform being configured as a terminal device, the terminal device including a mobile device and a tablet computer: the management platform including a processing device, the processing device including a server or a server group; the sensor network platform including a plurality of sensor network sub-platforms; different regions to be expanded corresponding to different sensor network sub-platforms; the different sensor network sub-platforms corresponding to different management sub-platforms; the sensor network platform being configured as a communication network and a gateway, the plurality of sensor network sub-platforms being configured as independent gateways; the object platform being configured to include at least one charging pile, the at least one charging pile including a positioning device and a camera device; the user platform being configured to issues a query instruction of urban charging pile construction planning to the service platform; the service platform issues the query instruction of urban charging pile construction planning to the management platform, and the service platform receives an urban charging pile construction planning scheme uploaded by the management platform; the management platform including a general database and the plurality of management sub-platforms; the sensor network platform being configured to, in response to a query instruction issued by a management sub-platform of the management platform, obtain charging pile related data from a corresponding region in the object platform through a corresponding sensor network sub-platform and upload the charging pile related data to a corresponding management sub-platform of the management platform; the method comprising:

- obtaining a region feature of the region to be expanded; the region feature of the region to be expanded being obtained based on the object platform and uploaded to the corresponding management sub-platform based on a sensor network sub-platform corresponding to the region to be expanded;
- determining at least one candidate construction site based on the region feature;
- wherein the region feature at least includes distribution of people flow in the region to be expanded and distribution of existing charging piles in the region to be expanded;
- determining at least one target construction site based on the at least one candidate construction site, comprising:
  - constructing a first candidate feature map based on the at least one candidate construction site, wherein the first candidate feature map includes nodes and edges, the nodes correspond to preset facilities in the region to be expanded, the edges represent roads between the preset facilities corresponding to the nodes, a feature of each of the edges includes a length and convenience of a road corresponding to the edge, and the convenience includes an average spending time;
  - retaining at least a part of first nodes that satisfy a preset node condition in the first candidate feature map, deleting remaining first nodes and corresponding edges, and obtaining a second candidate feature map based on a modified first candidate feature map, the preset node condition including: an expected average queuing time not exceeding a time threshold, and an expected electric vehicle flow not being lower than a preset flow threshold; wherein the expected electric vehicle flow and the expected average queuing time of each of the at least a part of first nodes are predicted through a second prediction model, the second prediction model is a graph neural network (GNN) model; an input of the second prediction model is the first candidate feature map, and an output of the second prediction model includes expected average queuing times and expected electric vehicle flows of candidate construction sites corresponding to all first nodes in the first candidate feature map; the output of the second prediction model is obtained based on an output of the nodes, and the expected electric vehicle flow is characterized by an estimated monthly average flow or an annual average flow; the second prediction model is trained by a plurality of training samples with labels, comprising: inputting the plurality of training samples with labels into an initial second prediction model, constructing a loss function by using the labels and results of the initial second prediction model, and iteratively updating parameters of the initial second prediction model based on the loss function; when the loss function of the initial second prediction model satisfies a preset condition, completing model training to obtain a trained second prediction model, the preset condition including that the loss function converges or a number of iterations reaches a threshold; and determining the at least one target construction site based on at least one second candidate feature map; and transmitting the at least one target construction site to the service platform through the general database of the management platform, and uploading the at least one target construction site to the user platform based on the service platform; the user platform receiving the urban charging pile construction planning scheme uploaded by the service platform and feeding back a construction planning result of urban charging piles to a user through the terminal device.

2. The method of claim 1, wherein the region feature further includes distribution of economic level in the region to be expanded; the distribution of economic level refers to distribution of economic in the region to be expanded in different time periods or distribution of economic of different sub-regions of the region to be expanded at the same time; the distribution of economic level includes a distribution of the gross domestic product and distribution of resident income.

3. The method of claim 1, wherein the region feature further includes traffic convenience in the region to be expanded; determining factors of traffic convenience includes factors of municipal public facilities, factors of secondary disasters, and factors of electric power resources.

4. The method of claim 1, wherein the determining at least one target construction site based on the at least one candidate construction site comprises:

predicting an expected benefit of the candidate construction site through processing a site feature of each candidate construction site in the at least one candidate construction site based on a first prediction model, wherein the first prediction model is a machine learning model; and determining the target construction site based on the expected benefit of the candidate construction site; wherein the input of the first prediction mode further includes arrival convenience of reaching the candidate construction site from the preset site.

5. The method of claim 1, wherein the determining at least one target construction site based on the at least one second candidate feature map comprises:

determining a plurality of first candidate expansion maps based on the at least one second candidate feature map;

determining a target expansion map through performing a plurality of rounds of iteration updates on the plurality of first candidate expansion maps until a preset iterative condition is satisfied; and determining the at least one target construction site based on the target expansion map;

wherein at least one round of iteration in the plurality of rounds of iteration updates comprises:

determining an evaluation value of each first candidate expansion map in the plurality of first candidate expansion maps, wherein when a number of round of iteration is 1, the first candidate expansion map is the at least one second candidate feature map; when the number of round of iteration is larger than 1, the first candidate expansion map is a third candidate expansion map obtained from a previous round of iteration;

determining a second candidate expansion map from the plurality of first candidate expansion maps based on the evaluation value or evaluation parameter of the first candidate expansion map;

determining the third candidate expansion map through performing a transformation processing on the second candidate expansion map;

wherein the transformation processing includes a first transformation and a second transformation;

the first transformation includes: selecting at least two second candidate expansion maps from a plurality of the second candidate expansion maps, exchanging one or more nodes in the at least two second candidate expansion maps to generate at least two candidate maps, and determining the third candidate expansion map based on the at least two candidate maps; and the second transformation includes: deleting or adding a node in a preliminary map to generate at least one third candidate expansion map, wherein the preliminary map is the second candidate expansion map or the at least two candidate maps; and determining the first candidate expansion map of a next round of iteration or the target expansion map based on the third candidate expansion map;

wherein the preset iterative condition includes at least one of the number of round of iteration being not less than a preset round value;

the evaluation value of the first candidate expansion map being not less than a preset evaluation value; and in at least two consecutive rounds of iteration, a change of the evaluation value of the first candidate expansion map being smaller than a preset change value.

6. An Internet of Things system for construction planning of a charging pile in a smart city, including a user platform, a service platform, a management platform, a sensor network platform, and an object platform; the user platform being configured as a terminal device, the terminal device including a mobile device and a tablet computer; the management platform including a processing device, the processing device including a server or a server group;

the sensor network platform including a plurality of sensor network sub-platforms; different regions to be expanded correspond to different the sensor network sub-platforms; the sensor network platform being configured as a communication network and a gateway, the plurality of sensor network sub-platforms being configured as independent gateways; the object platform being configured to include at least one charging pile, the at least one charging pile including a positioning device and a camera device; the user platform being configured to issues a query instruction of urban charging pile construction planning to the service platform; the service platform issues the query instruction of urban charging pile construction planning to the management platform, and the service platform receives an urban charging pile construction planning scheme uploaded by the management platform; the management platform including a general database and the plurality of management sub-platforms; the sensor network platform being configured to, in response to a query instruction issued by a management sub-platform of the management platform, obtain charging pile related data from a corresponding region in the object platform through a corresponding sensor network sub-platform and upload the charging pile related data to a corresponding management sub-platform of the management platform;

the management platform includes a general database of the management platform and a plurality of management sub-platforms;

the object platform is configured to obtain region feature of the region to be expanded; the region feature of the region to be expanded being obtained based on the object platform and uploaded to the corresponding management sub-platform based on a sensor network sub-platform corresponding to the region to be expanded;

the sensor network sub-platform is configured to obtain the region feature of the corresponding region to be expanded based on the object platform, and upload the region feature to the corresponding management sub-platform;

the management sub-platform is configured to perform operations including:

determining at least one candidate construction site based on the region feature, wherein the region feature at least includes distribution of people flow in the region to be expanded and distribution of existing charging piles in the region to be expanded;

determining at least one target construction site based on the at least one candidate construction site, comprising:

constructing a first candidate feature map based on the at least one candidate construction site, wherein the first candidate feature map includes nodes and edges, the nodes correspond to preset facilities in the region to be expanded, the edges represent roads between the preset facilities corresponding to the nodes, a feature of each of the edges includes a length and convenience of a road corresponding to the edge, and the convenience includes an average spending time;

retaining at least a part of first nodes that satisfy a preset node condition in the first candidate feature map, deleting remaining first nodes and corresponding edges, and obtaining a second candidate feature map based on a modified first candidate feature map, the preset node condition including: an expected average queuing time not exceeding a time threshold, and an expected electric vehicle flow not being lower than a preset flow threshold; wherein the expected electric vehicle flow and the expected average queuing time of each of the at least a part of first nodes are predicted through a second prediction model, the second prediction model is a graph neural network (GNN) model; an input of the second prediction model is the first candidate feature map, and an output of the second prediction model includes expected average queuing times and expected electric vehicle flows of candidate construction sites corresponding to all first nodes in the first candidate feature map; the output of the second prediction model is obtained based on an output of the nodes, and the expected electric vehicle flow is characterized by an estimated monthly average flow or an annual average flow; the second prediction model is trained by a plurality of training samples with labels, comprising: inputting the plurality of training samples with labels into an initial second prediction model, constructing a loss function by using the labels and results of the initial second prediction model, and iteratively updating parameters of the initial second prediction model based on the loss function; when the loss function of the initial second prediction model satisfies a preset condition, completing model training to obtain a trained second prediction model, the preset condition including that the loss function converges or a number of iterations reaches a threshold; and determining the at least one target construction site based on at least one second candidate feature map; and transmitting at least one target construction site to the service platform through the general database of the management platform;

the service platform is configured to upload the at least one target construction site to the user platform; and the user platform receiving the urban charging pile construction planning scheme uploaded by the service platform and feeding back a construction planning result of urban charging piles to a user through the terminal device.

7. The system of claim 6, the management sub-platform is further configured to perform operation including:

predicting an expected benefit of the candidate construction site through processing a site feature of each candidate construction site in the at least one candidate construction site by a first prediction model, wherein the first prediction model is a machine learning model; and determining the target construction site according to the expected benefit of the candidate construction site; wherein the input of the first prediction mode further includes arrival convenience of reaching the candidate construction site from the preset site.

8. The system of claim 6, wherein the management sub-platform is further configured to perform operations including:

determining a plurality of first candidate expansion maps based on the at least one second candidate feature map;

determining a target expansion map through performing a plurality of rounds of iteration updates on the plurality of first candidate expansion maps until a preset iterative condition is satisfied, and determining at least one target construction site based on the target expansion map;

wherein at least one round of iteration in the plurality of rounds of iteration updates comprises:

determining an evaluation value of each first candidate expansion map in the plurality of first candidate expansion maps, wherein when a number of round of iteration is 1, the first candidate expansion map is the at least one second candidate feature map; when the number of round of iteration is larger than 1, the first candidate expansion map is a third candidate expansion map obtained from a previous round of iteration;

determining a second candidate expansion map from the plurality of first candidate expansion maps based on the evaluation value or evaluation parameter of the first candidate expansion map;

determining the third candidate expansion map through performing a transformation processing on the second candidate expansion map;

wherein the transformation processing includes a first transformation and a second transformation;

the first transformation includes: selecting at least two second candidate expansion maps from a plurality of the second candidate expansion maps, exchanging one or more nodes in the at least two second candidate expansion maps to generate at least two candidate maps, and determining the third candidate expansion map based on the at least two candidate maps; and the second transformation includes: deleting or adding a node in a preliminary map to generate at least one third candidate expansion map, wherein the preliminary map is the second candidate expansion map or the at least two candidate maps; and determining the first candidate expansion map of a next round of iteration or the target expansion map based on the third candidate expansion map;

wherein the preset iterative condition includes at least one of the number of round of iteration being not less than a preset round value;

the evaluation value of the first candidate expansion map being not less than a preset evaluation value; and in at least two consecutive rounds of iteration, a change of the evaluation value of the first candidate expansion map being smaller than a preset change value.

9. A non-transitory computer-readable storage medium storing computer instructions, when the computer instructions are executed by a processor, a method for construction planning of a charging pile in a smart city of claim 1 is implemented.

10. The method of claim 5, wherein the evaluation value of the first candidate expansion map is positively correlated with a weighted sum of expected revenues of a plurality of candidate construction site nodes in the first candidate expansion map; and a weight coefficient of each of the candidate construction site nodes is negatively correlated with a convenience of reaching a nearest important facility node or an important facility node with a people flow greater than a people flow threshold.

11. The method of claim 10, wherein the nodes selected in the first transformation and the second transformation are determined based on an expected revenue of at least one candidate construction site node and an estimated average queuing time of the at least one candidate construction site node in the second candidate expansion map.

* * * * *